METHOD FOR FABRICATING FIELD-EFFECT TRANSISTOR DEVICES AND INTEGRATED CIRCUIT MODULES CONTAINING THE SAME BY SELECTIVE DIFFUSION OF ACTIVATOR IMPURITIES THROUGH PRESELECTED PORTIONS OF PASSIVATING-INSULATING FILMS

Filed Oct. 13, 1967 3 Sheets-Sheet 1

Inventors:
Dale M. Brown,
William E. Engeler,
by John F. Ahern
Their Attorney.

METHOD FOR FABRICATING FIELD-EFFECT TRANSISTOR DEVICES AND INTEGRATED CIRCUIT MODULES CONTAINING THE SAME BY SELECTIVE DIFFUSION OF ACTIVATOR IMPURITIES THROUGH PRESELECTED PORTIONS OF PASSIVATING-INSULATING FILMS

Filed Oct. 13, 1967

Inventors:
Dale M. Brown,
William E. Engeler,
by John F. Ahern
Their Attorney.

March 2, 1971 D. M. BROWN ET AL 3,566,518
METHOD FOR FABRICATING FIELD-EFFECT TRANSISTOR DEVICES AND INTEGRATED CIRCUIT MODULES CONTAINING THE SAME BY SELECTIVE DIFFUSION OF ACTIVATOR IMPURITIES THROUGH PRESELECTED PORTIONS OF PASSIVATING-INSULATING FILMS
Filed Oct. 13, 1967 3 Sheets-Sheet 3
Fig. 5.
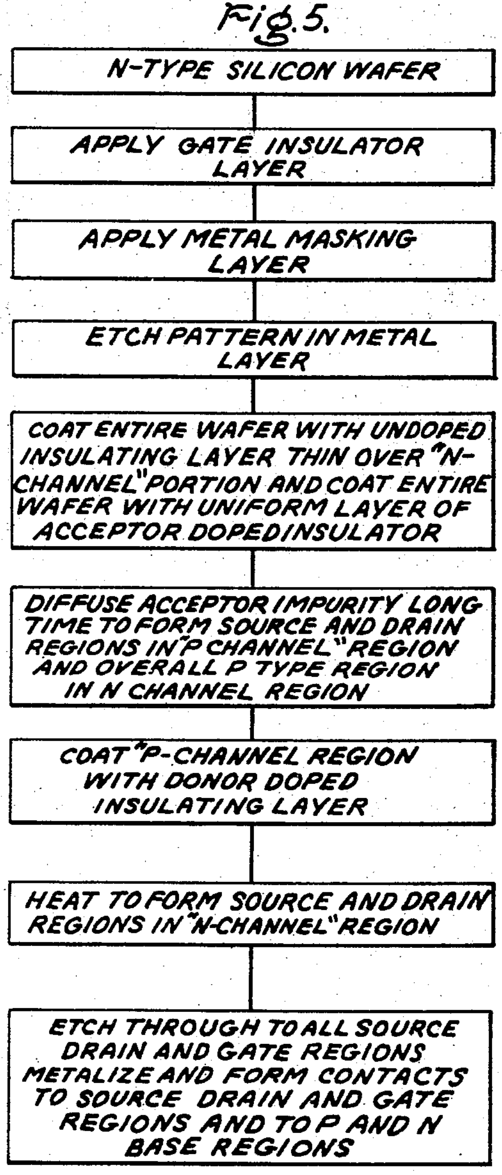
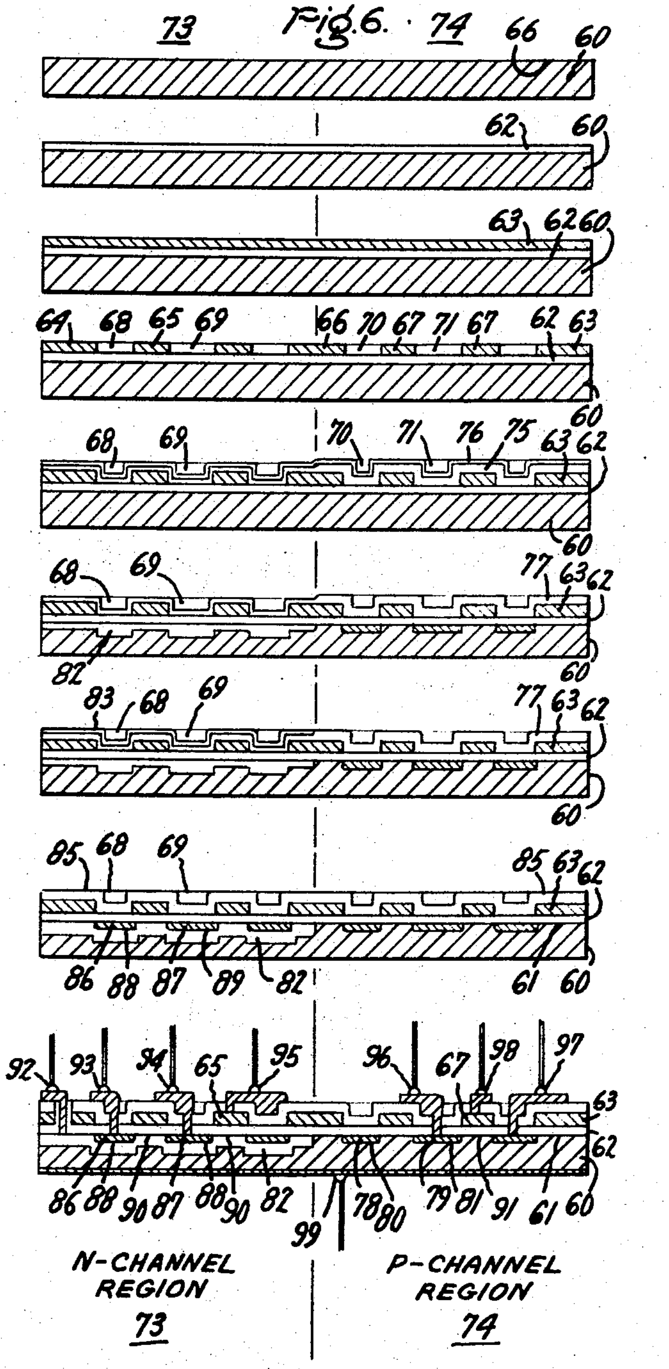
Inventors:
Dale M. Brown,
William E. Engeler,
by John F. Ahern
Their Attorney.

United States Patent Office 3,566,518
Patented Mar. 2, 1971

3,566,518

METHOD FOR FABRICATING FIELD-EFFECT TRANSISTOR DEVICES AND INTEGRATED CIRCUIT MODULES CONTAINING THE SAME BY SELECTIVE DIFFUSION OF ACTIVATOR IMPURITIES THROUGH PRESELECTED PORTIONS OF PASSIVATING-INSULATING FILMS

Dale M. Brown, Schenectady, and William E. Engeler, Scotia, N.Y., assignors to General Electric Company Filed Oct. 13, 1967, Ser. No. 679,957
Int. Cl. B01j 17/00; H01g 13/00
U.S. Cl. 29—571 18 Claims

ABSTRACT OF THE DISCLOSURE

Improved semiconductor field-effect transistors have self-registration and electrical insulation. Conductivity-modified, surface-adjacent source and drain regions are formed by diffusing dopants through gate-oxide layer. One embodiment features a conducting gate electrode which is formed from a thin deposited film. In this embodiment a large region of opposite-conductivity-type semiconductor is formed by diffusion through both conducting and oxide films. Complementary "N-channel" and "P-channel" devices may be formed on the same substrate by combining two separate embodiments. In such devices the original conductivity-type semiconductor is the base for one FET, while the large conductivity-modified type region is the base for the other FET. Such modules may be interconnected to form integrated circuits capable of performing a variety of logical functions.

THE DISCLOSURE

Figure 1:
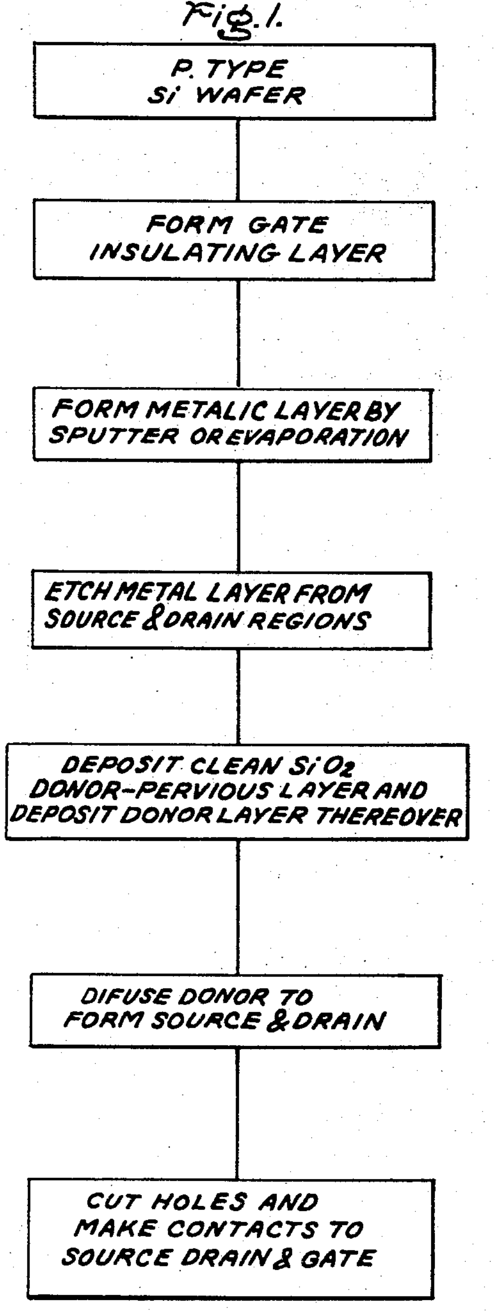

The present invention relates to improved field-effect transistors and methods of making the same. More particularly, the present invention relates to field-effect transistors having improved insulating films and having greatly increased flexibility insofar as fabrication of modules containing a plurality of such devices in the formation of integrated circuits.

The present application is related to the copending concurrently-filed applications: Ser. No. 675,228—Brown, Engeler, Garfinkle, and Gray; Ser. No. 675,225—Engeler; Ser. No. 675,227—Brown and Garfinkle, now abandoned; Ser. No. 675,226—Brown and Engeler, now abandoned, all of which are assigned to the present assignee and incorporated herein by reference thereto.

Field-effect transistors, in general, include a pair of opposite-conductivity-type regions adjacent a major surface of a one-conductivity-type, monocrystalline, semiconductor body, wherein the discrete regions, known as source and drain, are separated by a narrow-channel region over which a gate electrode is juxtaposed. Conduction between the two regions occurs through the surface-adjacent channel between the two regions and is modulated by a potential applied to the gate electrode. In the fabrication of field-effect transistors, surface phenomena are exceedingly important. It is, therefore, essential that the quality characteristics and purity of the insulating film covering the surface adjacent the source and drain regions be high.

The films utilized for such protection are often called passivating films, in that they stabilize or passivate the intersections of P-N junctions with the surface of the distribution is most susceptible to breakdown and resultant failure of the device. In most instances, passive layers are high-purity oxide layers, for example, a silicon field-effect transistor is most often passivated with a silicon-dioxide layer. Silicon-dioxide films upon silicon monocrystalline wafers may be formed in a variety of ways. They may be formed by the pyrolysis of gas containing the components thereof, or they may be grown by heating a fresh silicon surface in an atmosphere of pure, dry oxygen. The latter process, without question, produces the most nearly perfect and purest oxide films. Such films form high quality interfaces with silicon semiconductor surfaces. Accordingly, most silicon field-effect transistors are fabricated by the formation of thermally-grown oxide layers.

During the fabrication of field-effect transistors, it is necessary that surface-adjacent regions be diffused with activator impurities for the conversion of source and drain regions to opposite conductivity-type from the main body of the semiconductor wafer to establish source and drain P-N junctions. In most instances, this is accomplished by etching away portions of the silicon dioxide film, diffusing the preselected dopant into discrete regions at which the oxide has been etched away to form source and drain regions, and then redepositing a layer of silicon dioxide or another passivating material. If the foregoing procedure is followed, the passivating layer so formed is inferior, since even if thermal growth is utilized, the purity of the oxide formed by thermal growth depends upon the purity of the silicon upon which it is grown. After diffusion, the silicon of the source and drain regions is contaminated with the impurity activator and, therefore, thermally-grown oxide films formed thereover are less pure than, and inferior to, thermally-grown oxide regions made from undiffused silicon.

Accordingly, one object of the present invention is to provide improved field-effect transistors having improved passivation layers.

Still another object of the present invention, is to provide for the fabrication of field-effect transistors wherein it is not necessary to remove a passivating layer from the semiconducting surface to form source and drain regions therein.

Still another object of the present invention is to provide field-effect transistors having one-conductivity-type channels on a semiconductor wafer of a one-conductivity type.

Yet another object of the present invention is to provide semiconductor modules including complementary field-effect transistors, that is, adjacent field-effect transistors on the same substrate having channels of different conductivity types.

Briefly stated, in accord with one feature of the present invention, field-effect transistors are fabricated by forming source and drain regions by diffusing activator impurities through a thermally-grown passivation film, which diffusion does not affect the insulating characteristics of the passivation film, providing field-effect transistors that have improved passivation and are more stable and less subject to surface leakage. In accord with a separate embodiment of the invention, a base region of opposite-conductivity type is formed by diffusion through a metallic film and a passivating film on one portion of a semiconductor body having one-conductivity type and source and drain regions of opposite-conductivity type are formed within the base region and a gate electrode is formed, all without disturbing the passivation film. The passivation film is penetrated only for the purpose of making contact to source and drain regions and is then isolated from ambient atmosphere.

In accord with another embodiment of the invention, a field-effect transistor in the foregoing embodiment is fabricated on one portion of a semiconductor wafer and, at an adjacent region thereof, another field-effect transistor having an opposite-type conductivity channel from the first field-effect transistor is formed to provide a complementary device which may be interconnected with other devices to form a variety of integrated circuit components and a variety of logical circuits.

Figure 2:
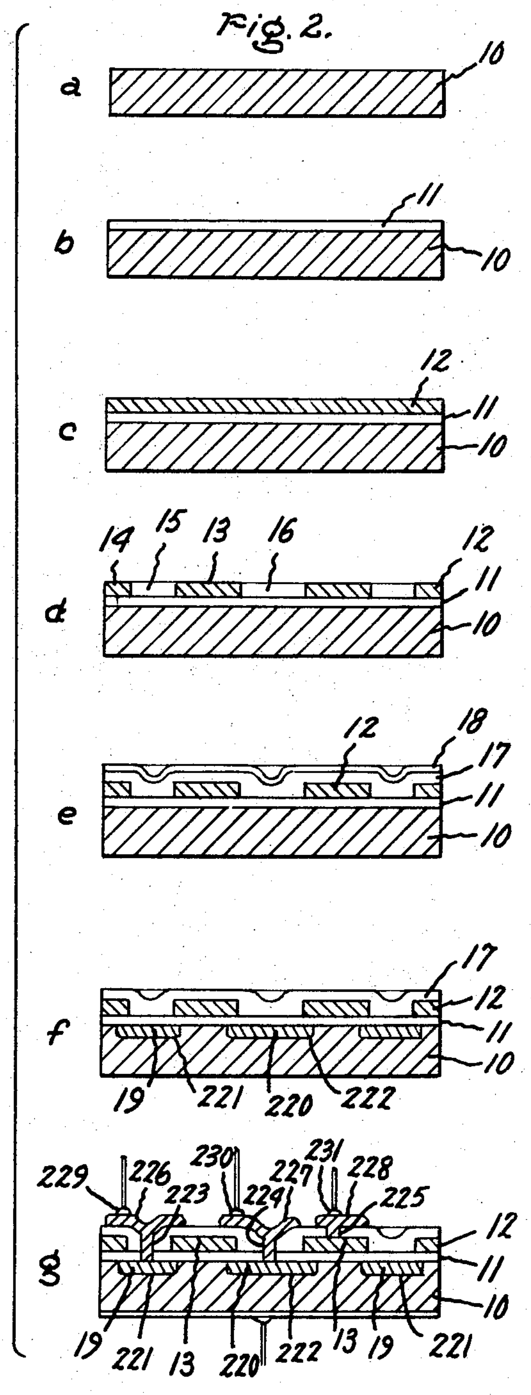
Figure 3:
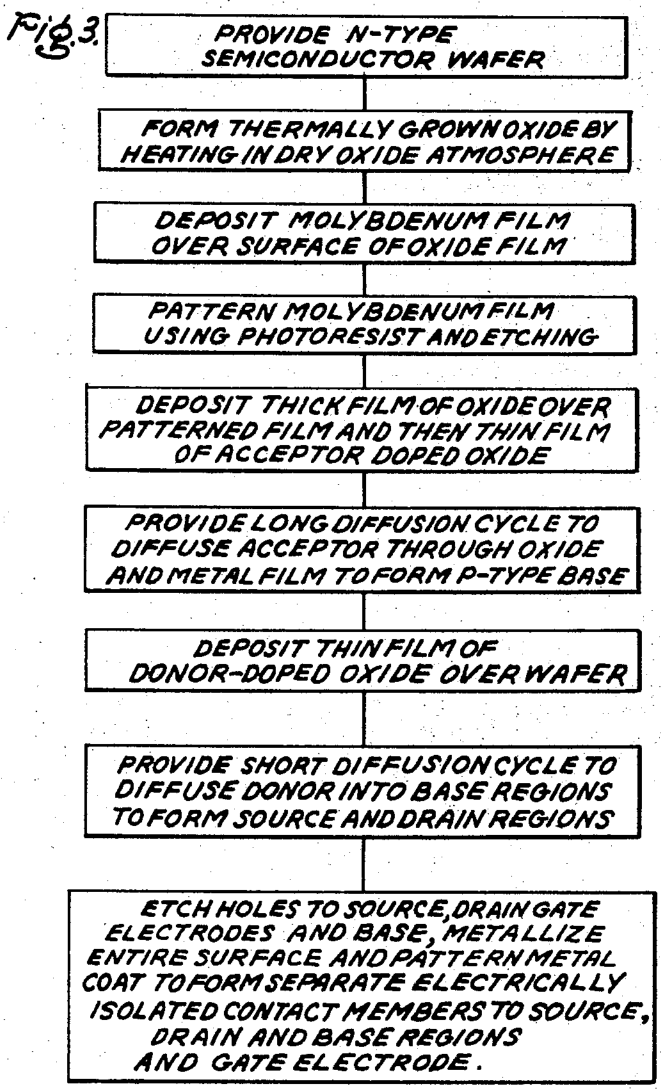
Figures 7, 8:
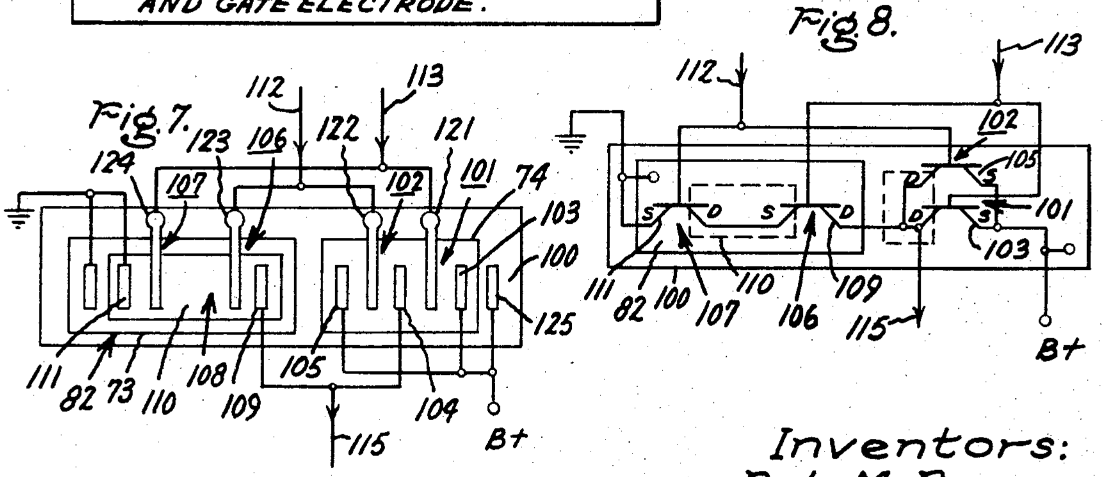

The novel features believed characteristic of the present invention are set forth in the appended claims. The invention itself, together with further objects and advantages thereof, may best be understood by reference to the following detailed description taken in connection with the appended drawing in which:

FIG. 1 is a flow diagram of a method for fabricating a field-effect transistor in accord with one embodiment of the present invention, FIG. 2*a–g* is a series of schematic illustrations of a vertical cross section of a semiconductor wafer in the process of fabrication of a field-effect transistor in accord with the method of the flow diagram of FIG. 1, each illustration corresponding to one of the process steps in the diagram of FIG. 1, FIG. 3 is a flow diagram illustrating the process of forming a one-conductivity-type channel field-effect transistor in a one-conductivity-type semiconductor body, FIG. 4*a–i* is a series of schematic illustrations of a vertical cross section of semiconductor wafer in the respective steps of formation according to the process of the diagram of FIG. 3, each of which coresponds to one of these steps, FIG. 5 is a flow diagram illustrating a process for the formation of complementary field-effect transistors on the same semiconductor substrate, FIG. 6*a–i* is a series of schematic, cross-sectional views of a semiconductor wafer illustrating sequential states of a semiconductor wafer corresponding to the steps of the process of the diagram of FIG. 5, FIG. 7 is a schematic plan view of an integrated circuit module which illustrates a circuit configuration whereby a pair of complementary field-effect transistors are conected to form a logical circuit element, and FIG. 8 is a schematic circuit diagram of the circuit of FIG. 7.

In FIGS. 1 and 2, a plurality of field-effect transistors, each having a concentric configuration and a density of approximately 2500 transistors per square inch, may be formed in accord with one embodiment of the invention upon the surface of a P-type silicon wafer 10 having P-type conductivity characteristics caused by the inclusion therein of a relatively light doping of the order of $10^{16}$ atoms of boron per cubic centimeter thereof. Although the invention may be practiced using other semiconductors, such as germanium, gallium arsenide, etc., for ease of description, the invention will be described as practiced in forming silicon devices. Such a wafer may be a disc, having a diameter of approximately one inch and a thickness of approximately 0.014 inch.

To begin the process a suitably prepared wafer is inserted in a reaction chamber and heated to a temperature of the order of 1000–1200° C. for approximately one to two hours in an atmosphere of pure dry oxygen to form a thermally-grown film 11 of silicon dioxide of approximately 1000 A.U. thickness. In some instances the wafer may be prepared by depositing thereon a patterned film of silicon nitride in advance. Since the oxide film is grown upon a relatively high-purity silicon substrate in an atmosphere of high-purity dry oxygen, the film is of high purity and perfection, substantially uniform in thickness, and of high quality as an electrical insulator. After thermal growth, the oxide may be annealed in an inert atmosphere, for example, helium to improve the oxide-silicon interface.

After the formation of a film 11 of silicon dioxide upon wafer 10, the oxide wafer is coated with a film 12 of a refractory metal such as molybdenum or tungsten which has good adherence characteristics to the silicon dioxide insulating and passivation film 11 and which is chemically inert in the presence of the insulating film at diffusion temperatures. The metal must be etchable in an etchant to which the passivation film is etch resistant. Such a film 12 may be formed upon the surface of insulating film 11 by sputtering of a molybdenum target in a triode glow discharge of 0.015 torr of argon, for example, for 15 minutes, while the substrate is maintained at a temperature of approximately 400° C. After approximately 15 minutes of sputtering, a thin molybdenum film 12 which may, for example, have a thickness of 5000 A.U. is formed. The thickness of the molybdenum film is subject to great variation and may readily be controlled by length of exposure to the sputtered refractory metal, as for example, molybdenum. In operation, films as thin as 700 A.U. and as thick as 10,000 A.U. may be formed and utilized in accord with the present invention.

Subsequent to the formation of film 12, a pattern is formed in the molybdenum film by selectively etching portions thereof away by an etchant which is reactive with the metallic film to cause the dissolution thereof, but which is nonreactive with the passivating film. To accomplish this conventional photolithographic techniques using photoresists and irradiation thereof are used. Suitable photoresists are well known to the art and may, for example, be obtained from Eastman Kodak Company of Rochester, N.Y., one common photoresist being sold under the name of KPR. The photoresist is uniformly deposited, as for example, by coating over the surface of the molybdenum film and a suitable mask containing a pattern desired to be impressed upon the molybdenum film is placed thereover. The photoresist-covered wafer is irradiated through the photoresist mask and the portions thereof which are desired to be maintained are exposed while the portions which are desired to be removed are covered. Subsequent to the irradiation of the photoresist, the wafer is immersed in a suitable developer, as for example, Eastman Kodak Photoresist Developer, to cause the unexposed photoresist to be removed and dissolved away, leaving the irradiated photoresist.

After developing, the photoresist and the wafer are heated, as for example, to a temperature of 150° C. for a period of approximately 40 minutes, for example, to cause the photoresist to harden to a degree commensurate with etch-masking. After hardening, the film is immersed in a suitable solvent for the metal, in the case of molybdenum, for example, in a ferricyanide etch, which may, for example, be composed of 92 grams of potassium cyanide, 20 grams of potassium hydroxide, and 300 grams of water. Since the ferricyanide etchant removes molybdenum at a rate of about 9000 A.U. per minute, the thickness of the molybdenum film determines the length of the etch bath, the unmasked portion of a 5000 A.U. thick molybdenum film being removed in approximately one half minute.

The configuration of an etched molybdenum film 12, having an annular gate electrode-forming member 13 and an annular peripheral member 14 together with a source-diffusion aperture 15 and a drain-diffusion aperture 16, is illustrated in FIG. 2*d*. Members 13 and 14 comprise metal-remaining portions and portions 15 and 16 comprise metal-removed portions of a pattern etched in the molybdenum film 12.

A protective film 17 of an insulator, as for example, silicon dioxide, is next formed over the patterned metallic film 12, and may convevniently have a thickness of approximately 1000 A.U. Such a film may be formed by pyrolysis from ethyl orthosilicate upon the wafer while it is heated to a temperature of approximately 800° C. The foregoing thickness achieved by maintaining the heated wafer in a flow of argon-saturated ethyl orthosilicate at a flow rate of seven cubic feet per hour for approximately 5 minutes.

After the formation of undoped layer 17 of silicon dioxide over the patterned metal film 12, a suitable activator-doped film 18 is deposited thereover. Since the substrate 10 possesses P-type conductiity characteristics and it is desired to induce source and drain regions therein having opposite-conductivity-type characteristics, a donor-doped insulating material, as for example phosphorus-doped silicon dioxide glass may be deposited. This may be achieved by the pyrolysis of ethyl orthosilicate and triethyl phosphate in a 10:1 volumetric ratio. To accomplish this, argon gas is bubbled through ethyl orthosilicate at a rate of seven cubic feet per hour and through triethyl phosphate at a rate of 0.7 cubic feet per hour and the resultant vapors mixed and passed over the silicon wafer at a composite flow rate of 7.7 cubic feet per hour. With the heated substrate at a temperature of 800° C., approximately 3 minutes is sufficient to form a 1000 A.U. thick film 18 of phosphorus-doped silicon dioxide.

After deposition of the phosphorus-doped glass, the wafer is heated, as for example, to a temperature of approximately 1100° C. for approximately 30 hours to cause penetration of the phosphorus atoms within layer 18 through layer 17, through oxide film 11, and diffusion into silicon wafer 10, to cause the formation of a central disc-shaped drain region 220 of N-type conductivity and a concentric annular source region 19 of N-type conductivity. As is indicated in FIG. 4*f* of the drawing, lateral diffusion also occurs, thus providing automatic registry of the source and drain regions with metal-remaining portion 13 of the pattern in film 12, which portion is subsequently utilized as the gate electrode. Both source and drain regions comprise N-type regions which define a source P-N junction 221 and a drain P-N junction 222, respectively, at the intersections with the main portion of P-type wafer 10. These P-N junctions intersect the major surface 1 of wafer 10, through which diffusion occurs, to form closed geometric patterns. In the case of the source, the geometric pattern is an annulus and in the case of the drain, the closed geometric pattern is a circle. The gate electrode formed by annulus 13 of patterned film 12 overlaps the junctions and covers all but the major part of the closed geometric portion of the wafer, effectively providing registry between source and drain, on one hand, and gate, on the other hand.

The sequence of deposition of oxide films 17 and 18 may be altered as desired. Thus, for example, doped film 18 may be deposited upon the patterned molybdenum film, and undoped film 17 may be deposited thereover before diffusion. This sequence reduces the time of the diffusion cycle. One disadvantage which may occur with the above sequence, is that some metals, used as film 12, may be adversely affected by donor dopants. To avoid this, another modification includes the deposition of undoped film 17 prior to patterning of film 12. Then the wafer is patterned down to insulating film 11. Doped film 18 is then deposited and diffusion takes place. Thus, film 17 need not be penetrated by dopant at 15 and 16, but film 17 serves to protect film 12 at 13 and 14.

A feature of the present invention is the formation of source and drain regions 19 and 220, respectively, with source and drain P-N junctions 221 and 222, respectively, in registry with, and terminating under, gate electrode 13 and intersecting major surface 1 of silicon wafer 10 at points which are passivated by the original thermally-grown oxide film 11, which has not been affected, as far at its insulating and passivating characteristics are concerned, by any difusion step due to protection by patterned film 12. Additionally, passivation is performed by the original, high-quality oxide film rather than by a film which is contaminated by etching away of the oxide in the region of the source and drain, to facilitate diffusion of activating impurities therethrough, and the subsequent reformation of either a pyrolytically-deposited oxide film or an oxide film which is thermally formed from the silicon regions of the source and drain. Such a thermally grown oxide would be of lesser quality that that which is grown from the original, relatively high-purity material of wafer 10, prior to diffusion. Devices of the prior art are subject to one or more of the foregoing disadvantages and one great advantage of the present invention lies in this improvement.

To complete formation of the field-effect transistor of the present embodiment, the diffused oxide-coated wafer is masked by photoresist and etching techniques, as is described hereinbefore with respect to patterning the molybdenum film, and small contact apertures are etched through the oxide film to the source and drain regions, on one hand, and to the gate electrode, on the other hand. The wafer is then immersed in a suitable etchant for silicon dioxide which may, for example, be a buffered HF solution comprising one part by volume of concentrated HF and ten parts by volume of 40 percent solution of $NH_4F$. This etchant etches silicon dioxide at a rate of approximately 1000 A.U. per minute and, thus, the etching process may be continued for a sufficient time to remove the thickness thereof without unduly contaminating the remainder of the wafer. The etching of source and drain contact apertures 223 and 224, respectively, through oxide film 11 does not affect the passivation characteristics thereof, since the holes are etched only to a portion of the source and drain regions 19 and 220, respectively, and the contamination due to etching does not extend into the region of the oxide layer which is over the intersection of the P-N junctions 221 and 222 with the surface 1.

After etching of apertures 223, 224, and 225 to source and drain regions and to gate electrode, the entire wafer may be metallized, the metal entering into apertures 223, 224, and 225 to contact source and drain regions and gate electrode. Such metallizing may be done, for example, by vacuum evaporation of aluminum, for example. Subsequent to metallization the metal film so formed is etched by a suitable etchant for aluminum, as for example, an orthophosphoric acid etchant comprising a mixture of 76 volume percent of orthophosphoric acid, 6 volume percent of glacial acetic acid, 3 volume percent of nitric acid, and 15 volume percent of water. Etching may be continued for approximately 90 seconds. Etching is performed after patterning the aluminum film by photoresist and etching techniques to retain only restricted portions of the aluminum film corresponding to source contact 226, drain contact 227, and gate contact 228. Individual devices may next be separated by conventional methods, before or after electrical contacts are made. Electrical contact may be made to source, drain, and gate by means of connections 229, 230, 231, respectively. These contacts may be applied by thermo-compression bonding, for example, or may be made by extending these regions to other entities upon the same substrate. The base of the field-effect transistor is constituted by the original one-conductivity (P-type) portion of wafer 10. Contact to the base may be made by alloying wafer 10 to a gold-plated header, for example.

The device fabricated in accord with the process illustrated in the flow diagram of FIG. 1 is illustrated schematically in vertical cross section in FIG. 2*g* of the drawing. In FIG. 2*g*, an annular source 19 having a source P-N junction 221 and a circular drain 220 having a drain P-N junction 222 are adjacent surface 1 of wafer 10. Gate electrode 13 overlaps the intersection of source and drain P-N junctions 221 and 222 to form a field-effect transistor (FET). An annular N channel 235 exists between source and drain regions 199 and 220, respectively, and conduction of carriers between source and drain regions may be modulated by the application of an electric potential to gate electrode 13.

It should be appreciated that the drawings herein are schematic and do not represent true dimension or proportions. Additionally. it should be understood that the source, drain and gate are not entirely symmetric, as shown, but that each is modified so as to provide contact tabs to facilitate making contact thereto.

Figure 4:
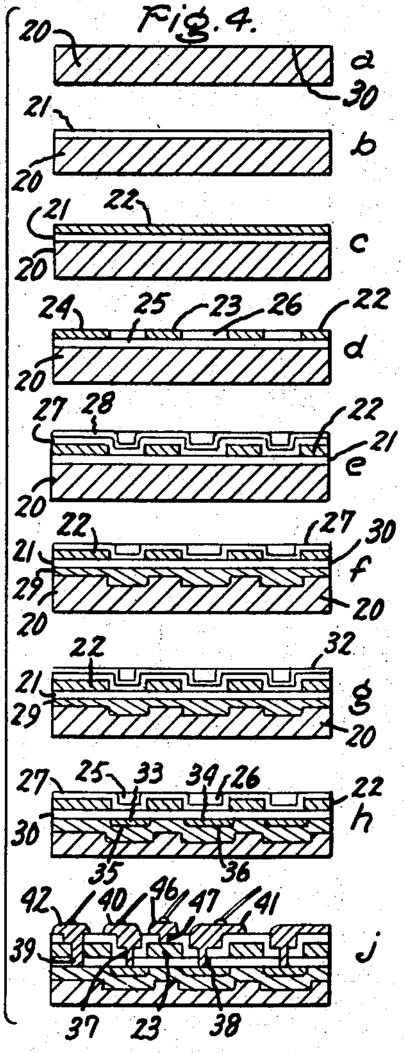

In accord with another embodiment of the present invention, illustrated in the flow diagram of FIG. 3 and the schematic cross-sectional views of FIG. 4, a one-conductivity-channel field-effect transistor may be fabricated in a wafer of a one-conductivity-type semiconductive body. This is as opposed to the embodiment of FIGS. 1 and 2, wherein an opposite-conductivity channel field-effect transistor is fabricated in a one-conductivity-type semiconductor wafer.

Fabrication of such a device is illustrated in FIG. 3 proceeds essentially as follows:

An N-type silicon wafer doped with a concentration of approximately $10^{16}$ atoms per cc. of phosphorus is utilized and a plurality of field-effect transistors having a concentration of approximately 2500 per square inch may be fabricated upon such a wafer having a disc-shaped configuration with a diameter of approximately one inch and a thickness of approximately 0.014 inch. A gate insulator of silicon dioxide having a thickness of approximately 1000 A.U., for example, is formed upon silicon semiconductor body 20, substantially as in the device described with respect to FIGS. 1 and 2. Film 21 is of high purity and is formed by thermal growth in a dry oxygen atmosphere. A metallic film 22 of, for example, molybdenum having a thickness of, for example, 3000 A.U., is formed upon silicon dioxide film 21 by triode glow discharge sputtering, as described above, while the wafer 20 is heated to a temperature of approximately 400° C.

The molybdenum film is then patterned to form metal-remaining portions 23 and 24 and metal-removed portions 25 and 26 of a pattern in film 22. This may be accomplished by photolithographic masking, utilizing photoresists and etching with a ferricyanide etch, as is described hereinbefore with respect to the process illustrated in FIGS. 1 and 2 of the drawings. A first-undoped thin film of silicon dioxide is next deposited upon the patterned molybdenum film 22. This, as in the embodiment described with respect to FIGS. 1 and 2, may be achieved by pyrolytic deposition from an argon atmosphere saturated with ethyl orthosilicate achieved by bubbling argon gas through liquid ethyl orthosilicate at a rate of approximately 7 cubic feet per hour and passing the saturated argon gas over the wafer while it is heated to a temperature of approximately 800° C. for approximately five minutes. A boron-doped layer of silicon dioxide is next deposited over undoped silicon dioxide layer 27 by pyrolytic deposition from a mixture of argon saturated with ethyl orthosilicate and a minor quantity of triethyl borate. This may be done by bubbling dry argon through ethyl orthosilicate at a rate of approximately 7 cubic feet per hour and bubbling dry argon through triethyl borate at a rate of approximately 0.7 cubic foot per hour and passing the two combined flows at a rate of approximately 7.7 cubic feet per hour over the wafer, while it is heated to a temperature of approximately 800° C. for approximately 3 minutes.

The silicon wafer 20, having thereon the insulating-passivating film 21, the patterned molybdenum film 22, the undoped silicon dioxide film 28, and the doped silicon dioxide film 28 is then heated in a reaction chamber to a temperature of approximately 1100° C. for approximately 20 hours to cause the boron in film 27 to penetrate through all intervening films and diffuse into wafer 10 to cause the formation of a P-type region 29 beneath surface 30 of wafer 20. Since, in the metal-removed regions 25 and 26 of patterned film 22, there is less resistance, the boron diffuses to a greater depth at this point than it does at other points, where it must pass through the metal-remaining portions 23 and 24 of patterned film 12. The depth is not critical, provided, however, that at all points the depth of the penetration of the base region is of the order of 10 microns, to permit subsequent formation of N-type source and drain regions in P-type region 29, which is to constitute the base region of a field-effect transistor. The condition of a portion of wafer 22 constituting a single field-effect transistor (FET) subsequent to the diffusion of boron to form base region 29, is illustrated in schematic vertical cross section in FIG. 2*f*. Boron-doped film 28 should next be removed, as for example, by etching in buffered HF, being careful not to remove film 21.

In the next step of the process in accord with the present invention, a thin film of phosphorus-doped silicon dioxide is formed over the entire wafer. This may be done, as in the previous embodiment illustrated in FIGS. 1 and 2, by the pyrolytic deposition of phosphorus-doped glass by pyrolysis from argon gas flowing continuously over the film at a rate of approximately 7.7 cubic feet per hour and being saturated with ethyl orthosilicate and triethyl phosphate in a 10:1 volume ratio. A phosphorus-doped film 32 of approximately 1000 A.U. thickness upon the wafer results.

After the formation of the phosphorus-doped silicon dioxide layer 32, the wafer is again heated in the reaction chamber at approximately 1100° C. for approximately 16 hours to cause the diffusion of phosphorus through passivating film 21 and into base region 29 to form discrete N-type source and drain regions 33 and 34, respectively, corresponding to metal-removed portions 25 and 26 of film 22. Source and drain regions 33 and 34, respectively, form source and drain P-N junctions 35 and 36 where they intersect with P-type base region 29. Junctions 35 and 36 form closed geometric patterns where they intersect surface 30.

To complete the field-effect transistor, it becomes necessary, at this point, to etch through the passivation film 21 and the silicon-dioxide film 32. To accomplish this, conventional photoresist and etching techniques are utilized, as is described in detail with respect to the embodiment of FIGS. 1 and 2 of the drawing, to form restricted dimension apertures 37 to the source region, 38 to the drain region, 39 to the base region 29, and 47 to metal-remaining portion 23 of patterned film 22 which constitutes a gate electrode. To form aperture 39, it is necessary, to etch the silicon dioxide film 27 with buffered HF, to reach portion 24 of film 22. The wafer is photoresist masked, leaving an aperture through which film 22 may be etched at 39 by immersing the wafer for approximately one minute in ferricyanide etch, described hereinbefore. Subsequent thereto, a second immersion in buffered HF etch permits etching through film 22 to reach base region 29. After etching to form apertures 37, 38, 47, and 39, the entire wafer may be metallized, as by vacuum evaporation of aluminum, and all but the contact terminal portions of the aluminum film removed by photoresist masking and etching in an orthophosphoric acid etch to pattern the aluminum film leaving source contact 40, drain contact 41, gate electrode contact 46, and base contact 42, which also contacts metal-remaining portion 24 of film 22.

The sequential steps set forth above for the formation of the device illustrated in FIG. 4*j* need not be in that exact order in all cases. Thus, for example, undoped film 27 could be deposited after doped film 32, prior to the cutting of apertures 37, 38, 39, and 47. This may be done prior to, or subsequent to, the final diffusion step. In still another alternative sequence, undoped film 27 may be deposited over molybdenum film 22 prior to the patterning thereof, and the holes 25 and 26 etched therein using the same mask as is used to etch film 22, with sequential etching steps using first buffered HF and then ferricyanide etch, respectively. Doped film 28 may then be deposited and diffused through film 21 to form base region 29, as before. Alternatively, undoped film 27 may be omitted entirely.

The device so formed is illustrated in FIG. 4*j* and comprises a wafer of N-type silicon 20 having therein a base region 29 of P-type boron-diffused silicon with a plurality of surface-adjacent, N-type, phosphorus-diffused regions 33 and 24, constituting source and drain regions, respectively, of a field-effect transistor. The annular region 45 immediately adjacent surface 30 of wafer 20 constitutes an N-channel, through which conduction of electrons between source and drain regions occurs. This conduction is modulated by the application of an electric potential to gate electrode 24 to provide for the amplification of an electric signal. This device is an N-channel FET on an N-type wafer. A particular advantage of this device, per se, is that its base may be effectively electrically isolated from the remainder of the substrate and any other devices thereon. For this reason, the P-N junction between the base 29 and wafer 20 is reverse biased. Contact to wafer 20 may be made, for example, by alloying to a header using a donor-containing alloy, such as gold, donor doped.

The combination of the devices of FIGS. 2*g* and 4*j* upon a single monocrystalline wafer having a given conductivity type is possible to form a semiconductor module having at least one pair of complementary field-effect transistors which may be utilized in an integrated circuit module. The formation of a two-unit, complementary field-effect transistor module is described by the flow diagram of FIG. 5. The condition of a wafer in the process of such formation is shown in schematic vertical cross section by FIGS. 6*a–i* which correspond to respective steps of the process of the flow diagram of FIG. 5. In FIG. 5*a,* a wafer 60 of a one-conductivity, monocrystalline semiconductor, as for example, N-type silicon, having a major surface 61 and a film 62 of an insulating, passivating substance covered with a patterned metallic film 63 of a refractory metal, which is nonreactive with the oxide and which may be etched by etchants which do not affect the oxide, may be formed as in the previously described embodiments of the invention, to form a wafer as illustrated in FIG. 6*d,* wherein wafer 60, having a major surface 61, has formed thereupon a silicon-dioxide film 62 of approximately 1000 A.U. in thickness and a molybdenum film 63 of approximately 3000 A.U. in thickness, patterned in two sections 73 and 74, each having separate circular symmetry, for example, to include metal-remaining portions 64, 65, 66, and 67 and metal-removed portions 68, 69, 70, and 71.

The wafer of FIG. 6*d* is the basis upon which a pair of adjacent field-effect transistors having separate radial symmetries are formed. In FIG. 6*d* metal-removed portions 68 and 69 are in the region of the wafer corresponding to the position of source and drain electrodes of a first field-effect transistor 73 to be formed, and metal-remaining portion 65 is to be utilized as a gate electrode for the same transistor. Similarly, metal-removed portions 70 and 71 correspond to the region at which a second source and drain region, respectively, are to be formed and metal-remaining portion 67 is to function as the gate electrode for a second field-effect transistor 74. Metal-remaining portion 66, as well as the other peripheral metal-remaining portions of film 63, function to protect the underlying passivating film 62 but do not function as an active portion of either of the field-effect transistors.

In the next step of forming complementary field-effect transistors on wafer 60, the patterned wafer illustrated in FIG. 6*d* is placed in a reaction chamber and heated to a temperature of approximately 800° C. and a pyrolytically-deposited film of silicon dioxide which is undoped and substantially pure is obtained by pyrolysis from a flowing stream of pure dry argon gas saturated with ethyl orthosilicate. As before, this saturated gas may conveniently be passed over the heated silicon wafer with the passivating film and the metallic pattern thereon heated to a temperature of approximately 800° C. This film should be of substantial thickness, conveniently of the order of 3000 A.U. Such a film may be formed by continuing the pyrolytic deposition process for approximately 15 minutes.

Subsequent to the formation of a thick silicon-dioxide film 75, the surface of the film is coated with a suitable photoresist material, as for example, KPR, and a mask which covers the first-transistor region 73, at which it is desired to form a one-conductivity-type FET in the one-conductivity wafer, and apertured at the portion of the wafer at which it is desired to form an opposite-conductivity type channel FET in the one-conductivity-type wafer. More particularly, referring to FIG. 6*d,* the left-hand portion 73 of the wafer to the left of the dashed center line is masked, while all of that portion 74 of the wafer to the right of the dashed center line is unmasked. The photoresist is then subjected to radiation and is developed in a Photoresist Developer and submerged in a Buffered HF etchant, for example, to remove approximately 1000 A.U. of the pyrolytically-deposited, 3000 A.U. thick silicon-dioxide film 75. This may be accomplished by immersion in Buffered HF solution for approximately two minutes.

After removal from the Buffered HF etchant, the wafer is washed in distilled water and returned to the reaction chamber where the entire wafer is coated with a thin pyrolytically-deposited layer of opposite-conductivity doped insulating material, as for example a 1000 A.U. thick film 76 of one percent boron-doped silicon dioxide, when the substrate 60 comprises P-type silicon. This may readily be accomplished by pyrolysis from a mixture of argon saturated with ethyl orthosilicate and partially saturated with triethyl borate. The combination of the two gases is flowed over the wafer while it is maintained at a temperature of approximately 800° C., as is described herein with respect to the embodiment illustrated in FIGS. 3 and 4 of the drawing.

After the formation of the boron-doped silicon-dioxide layer 76 over the entire surface of the wafer, the wafer is again heated to a diffusion temperature of, for example 1100° C., and maintained at this temperature for approximately 20 hours. In region 74, due to the extra thickness of the oxide layer, boron penetrates the passivating oxide layer 61 and diffuses into wafer 60 only at source and drain regions 70 and 71, respectively, to form P-type regions 78 and 79 within wafer 60, defining P-N junctions 80 and 81 therewith. In region 73 of wafer 60, a base region 82, which penetrates through the entire portion of surface 61 in region 73, is formed. The diffusion of boron in the regions of source and drain apertures 68 and 69 in region 73 of patterned film 63 is more deeply diffused, but this is not of great significance. Film 76 is next carefully removed by buffered HF etching, to remove the source of the boron.

The next step in the formation of the composite and complementary, field-effect transistor module is to provide for source and drain regions in region 73 of wafer 60. To accomplish this, the wafer is returned to the deposition reaction chamber and a film of opposite-conductivity-type activator doped insulator, as for example, phosphorus-doped silicon dioxide, is formed upon wafer 60, as in the previous examples, described hereinbefore. This may be readily accomplished by the pyrolysis from argon gas saturated with orthosilicate and triethyl phosphate in a volumetric ratio of approximately 10:1 as it flows past the wafer in the chamber at a combined rate of approximately 7.7 cubic feet per hour, with the wafer at a temperature of approximately 800° C. To form a film of approximately 1000 A.U. thickness, the pyrolysis may be carried out for approximately 5 minutes.

After the pyrolytic deposition of phosphorus-doped silicon dioxide film 83 over all of wafer 60, region 73 is covered with photoresist and the wafer is etched in buffered HF to remove film 83 from region 74. The wafer is then immersed in a suitable photoresist stripper, to remove the photoresist and placed in the diffusion chamber and heated for approximately 20 hours at a temperature of 1100° C., for example, to cause the uniting of oxide film 83 with film 77 to form a final oxide film 85, and the penetration of the phosphorus atoms through oxide film 62 and diffusion through the portion of surface 61 of wafer 60 in the region of the source and drain apertures 68 and 69 in patterned metallic film 63, to cause the formation of N-type source and drain regions 86 and 87, which define with region 82, source and drain P-N junctions 88 and 89, respectively.

With source and drain regions formed, it is next necessary to make electrical contact to base 82, to source and drain regions in each of regions 73 and 74, and to gate electrodes in each region. This may be accomplished by forming a film of photoresist over the entire wafer which masks all but the desired regions at which electrode connections are to be formed. The regions which must be masked, so as to allow etching thereof, are a small circular dot over each of the drain regions 87 and 79, respectively, a thin annulus having a restricted radial thickness over each of the source regions 86 and 78, respectively, and a relatively small aperture over a portion of base region 82, which is laterally removed from the source region and exterior thereof. This is to provide means to contact the base region 82. This requires remasking of the remainder of the wafer to allow for separate etching of films 63 and 62, respectively.

After masking these portions of the wafer, the photoresist is irradiated, washed in developer, and with a pattern exposing only the above-mentioned portions, the wafer is immersed in a buffered HF solution in order to etch away the silicon dioxide films 85 and 62. With respect to the contact made to the base region, an initial etch will etch down only to the patterned molybdenum film 63, so that an additional remasking and etching with potassium ferricyanide, as described hereinbefore is required. After etching and remasking, a subsequent etch in buffered HF solution for an appropriate time removes the portion of insulating and passivating layer 62 thereunder to expose base region 82.

After etching of the holes to both source and drain regions and to both gate electrodes and the base region of the transistor region 73 of water 60, the entire wafer is metallized by vacuum evaporation of aluminum, for example, as described hereinbefore, to cause aluminum to fill the apertures etched by the previous step and to make contact with source, drain, base regions, and gate electrodes and cover the entire surface of the wafer. The aluminum filling the base contact aperture contacts not only the base region 82, but the remaining portion 64 of molybdenum film 63. When a plurality of FET devices such as is formed on region 73 of wafer 60 are formed on the same wafer and incorporated into the same integrated circuit module, only one such base contact may be required, although if the circuit required electrical isolation therebetween, plural contacts are made and the pattern of FET devices is made so that each base region 82 is separate from other similar base regions and metal remaining portions 64 of film 63 are separated, as by etching and insulation.

The metallized wafer is next coated with a photoresist layer and irradiated through a mask which allows exposure of the regions at which the various contact members are to be made, each electrically isolated from the other, as desired. The metallized wafer is immersed in a suitable etchant for aluminum, as for example, the aforementioned mixture of orthophosphoric, glacial acetic acid, and nitric acid. Alternatively, if it is desired that any differing regions are to be internally connected, a connection path may be masked.

The resultant device is illustrated in FIG. 6*i* of the drawing. In FIG. 6*i*, the N-channel portion 73 of wafer 60 includes a P-type region 82 which functions as the base for a first field-effect transistor and is adjacent the upper surface 61 of wafer 60 over substantially all of portion 73 thereof. Within base region 82, a pair of surface-adjacent N-type, conductivity-modified regions 86 and 87 form source and drain regions, respectively, and define source and drain P-N junctions 88 and 89, respectively. Metal-remaining portion 65 of film 63 functions as a gate electrode covering the N-channel 90.

In region 74 of wafer 60, the main portion of wafer 60 serves as a base region for a P-channel field-effect transistor and surface-adjacent P-type regions 78 and 79 are diffused in surface-adjacent portions thereof, defining therewith source and drain P-N junctions 80 and 81, respectively. Metal-remaining region 67 of patterned molybdenum film 63 constitutes a gate electrode under which a P-channel 91, adjacent surface 61 between source and drain regions 78 and 79, respectively, is located and modulated. A base contact 92 is made to base 82. Source and drain contacts 93 and 94 are made to P-type source and drain regions 86 and 87, respectively. A gate contact 95 for FET 73 is made to gate electrode 65. Source and drain contacts 96 and 97 are made to P-type source and drain regions 78 and 79, respectively, and a gate contact 98 is made to gate electrode 67.

Conduction in the channel regions, as in the hereinbefore described embodiments, is modulated by the application of the potential to the respective gate electrodes. As in the other embodiments of the present invention, the source and drain P-N junctions intersect the surface 61 of wafer 60 under passivating layer 62 and are removed from that portion thereof through which electrical contact is made to the respective source and drain regions so that the passivation characteristic of the oxide layer is unaffected thereby. Similarly, since the P-N junctions are overlapped by the respective gate electrodes, automatic registration, of particular importance in enhancement mode FET's is obtained. As with the other embodiments the gate insulating film is continuous during all diffusion steps and is removed only at the end of fabrication, to form electrical contact to source and drain regions. Even then, the extent of coverage of the major surface of the wafer by the gate insulator is much greater than that over which the gate electrode extends, since the gate electrode serves to define the channel-adjacent portions of the source and drain regions. Thus, the passivation of the source and drain electrodes in accord with the invention is greatly superior to methods in which the gate oxide is removed to permit source and drain diffusion. Since the channels of the respective field-effect transistors are of opposite-conductivity type, numerous circuit configurations may be fabricated on a monocrystalline wafer to form a monolithic integrated circuit module.

As in the embodiments of FIGS. 2 and 4, the device of FIG. 6*i* may be formed with differing sequence of process steps as is specifically discussed with respect to the devices of FIGS. 2 and 4. Additionally, regions 73 and 74 wafer 60 of FIG. 6 may be masked, one from the other, and treated separately insofar as deposition of films and etching thereof. Only diffusion steps cannot be performed separately. For example, insulating film 75 may be deposited over the entire wafer prior to the patterning of film 63 and removed from all of region 73. Next a KPR film having apertures 68, 69, 70, and 71 may be formed on the wafer. Apertures 70 and 71 may then be formed in film 75 by etching in buffered HF. The wafer is next etched in ferricyanide etch to form apertures 68, 69, 70, and 71. Doped film 76 may then be applied and the process continued. The foregoing is of great advantage when, for example, film 75 is highly resistant to boron diffusion, for example, silicon nitride.

A pair of devices as illustrated in FIG. 6*i* may be interconnected by connecting source contact 93 to base contact 92 and to ground. Source contact 97 and wafer contact 99 are connected to B+. Drain contacts 94 and 96 are connected together and to an output terminal. Gate contacts 95 and 98 are connected together and to an input terminal. This module is connected to a similar module with gates of each module connected to the drains of the other to form a flip-flop circuit.

One integrated circuit module possible in the utilization of devices in accord with the present invention is illustrated semischematically in FIG. 7. In FIG. 7, an N-type monocrystalline silicon wafer 100 may have thereupon a pair of juxtaposed P-channel transistors 101 and 102, each comprising source, drain, and gate regions. Since field-effect transistors may be made in accordance with the present invention with a lateral geometry as well as the circular geometry illustrated in FIGS. 1–6, such a configuration is illustrated herein. Transistor 101 has a source 103 and drain 104, while transistor 102 has a source 105 and shared drain 104 with transistor 101. Similarly, a pair of N-channel transistors 106 and 107, complementary to transistors 101 and 102, are fabricated upon a P-type base region 82 which is formed upon N-type wafer 100. In this portion of the wafer, transistor 106 has a drain 109 and a source 110, which also serves as a drain for transistor 107, which has a source 111. In the fabrication of such a module, no external connection between source and drain 110 is required nor is any interconnection required between common drain 104.

As connected in FIG. 7, a pair of inputs 112 and 113 are connected to the gates 122 and 123 of transistors 102 and 106, respectively, on one hand, and gates 121 and 124 of transistors 101 and 107, on the other hand, respectively. The base region 82 of the N-channel transistors and the source 111 of transistor 107 are connected to ground, while the base 125 of the P-channel transistors thereof is connetced to $B^+$. The common drain 104 of transistors 101 and 102 and drain 109 of transistor 106 are connetced to an output terminal 115. Since the configuration of FIG. 7 is illustrated in a schematic-vertical plan view source and drain identification legends are shown as contacting the respective electrodes, rather than the regions, for purposes of clarity and convenience only.

To form a linear module including both N-channel and P-channel FET devices, as in FIG. 7, a wafer of N-type silicon, for example, is first pre-coated with a film of an insulator which is impervious to boron diffusion. Such a film may, for example, comprise a film of $Si_3N_4$ or a thick film of $SiO_2$. Next, regions 73 and 74 are etched to expose the silicon substrate. A thin film of passivating insulator is thermally grown at regions 73 and 74, as described hereinbefore. The molybdenum film 63 is patterned to form a plurality of metal-remaining gate regions having long, narrow strips and enlarged contact-forming regions extending over the aforementioned boron-diffusion resistant region, until the narrow strips juxtaposed over the thermally-grown oxide regions and extending past the edges thereof. The remainder of the molybdenum film is removed. The process described with respect to FIGS. 5 and 6 is continued, as described therein, except that phosphorus-doped layer 83 is removed from all of the surface of the wafer except at region 108 in FIG. 7, which is interior to base region 82. Thus, when the second diffusion step is performed, all of portions 108 of region 73, except those portions covered by the gate electrodes, are phosphorus-diffused, forming source and drain regions of transistors 106 and 107. Likewise, in the first diffusion step, boron atoms diffuse into all of region 74 not covered by the gate electrodes to form source and drain regions of transistors 101 and 102.

The semi-schematic illustration of FIG. 7 is transformed into a schematic diagram in FIG. 8, where it may be seen that transistors 101 and 102 are of the P-channel type fabricated upon the wafer as base, while transistors 106 and 107 are N-channel devices, fabricated upon a P-type base. In FIG. 8, it is readily apparent how the drains of transistors 101 and 102 are common and ganged and how the source of transistor 106 and the drain of transistor 107 are ganged and formed from a common region of the semiconductor body. The module illustrated in FIGS. 7 and 8 may be utilized as a negative AND logical circuit in which only a positive signal to both inputs 112 and 113 results in a negative output at output terminal 115. A negative input to either or both of terminals 112 and 113, results in a positive output at terminal 115. It is to be understood that many other logical circuits and modules may be constructed utilizing the complementary technique of forming both N and P channel FET devices in accord with the present invention upon the same semiconductor wafer to form either monolithic or hybrid type integrated circuit devices.

Devices as illustrated herein may be formed by the following examples:

EXAMPLE I

A device as illustrated in FIGS. 1 and 2 of the drawing is constructed substantially as follows. A (1, 0, 0) surface, one-inch diameter wafer of P-type silicon having a boron concentration therein of $5\times10^{15}$ atoms per cc. and a thickness of 0.014 inch is carefully etched in "white etch" (3 parts HF: one part $HNO_3$), washed in distilled water, and heated in a reaction chamber in an atmosphere of dry oxygen at a temperature of 1000° C. for 3 hours to form a film 1200 A.U. in thickness of silicon dioxide thereover. The wafer is annealed in helium at 1000° C. for 3 hours. The wafer is then heated to a temperature of 400° C. while a 5000 A.U. thick film of molybdenum is deposited thereon in a triode glow discharge with a molybdenum target in 0.015 torr of argon for 20 minutes. A film of KPR photo-resist is coated upon the surface of the molybdenum film and a mask having apertures therein corresponding to concentric source and drain regions is superposed over the wafer and the photoresist is irradiated therethrough. After irradiation the wafer is immersed in Photoresist Developer, which removes the unirradiated portions of the photoresist, and leaves the concentric pattern of the irradiated portions thereon. The wafer is washed in distilled water and then immersed in a ferricyanide etch for one minute to cause the removal of the molybdenum exposed through the photoresist pattern. After removing from the etchant and washing in distilled water, the wafer is scrubbed in trichloroethylene to remove the photoresist and placed in an oxide deposition chamber. A 1000 A.U. thick layer of one perecnt phosphorus-doped silicon dioxide is next formed on the wafer by passing the combined flow of a 7 cubic feet per hour flow of dry argon, which has been bubbled through orthosilicate and a 0.7 cubic foot per hour flow of dry argon bubbled through triethyl phosphate over the wafer while it is heated to a temperature of 800° C. for 3 minutes. The coated wafer is then heated to a temperature of 1100° C. for 15 hours in an atmosphere of argon and $CO_2$ to cause the phosphorus in the phosphorus-doped $SiO_2$ film to diffuse into surface-adjacent portions of the silicon wafer forming source and drain regions. A 3000 A.U. undoped film of silicon dioxide is formed over the diffused wafer by passage of an argon vapor saturated with ethyl orthosilicate obtained by bubbling dry argon through ethyl orthosilicate and passing the same over the wafer at a rate of 7 cubic feet per hour while the wafer is heated to a temperature of 800° C. After 15 minutes of this process, the undoped silicon-dioxide film is formed.

A photoresist layer is next coated over the wafer and the wafer is optically masked so as to cover electrode-contact regions in registry with, but substantially smaller than, the source and drain apertures in the molybdenum pattern and the gate electrode. After irradiation and developing in photoresist developer, a pattern of apertures corresponding to restricted portions of source and drain regions and gate electrode is formed in the photoresist. The wafer is immersed in buffered HF etching solution for four minutes to dissolve away the silicon dioxide down to the source and drain regions and gate-electrode portion of the molybdenum thereover forming restricted dimension source, drain, and gate contact apertures. The entire surface of the wafer is next metallized by vacuum evaporation of aluminum thereover for one minute and a photoresist layer containing apertures therein corresponding to source, drain, and gate electrodes is formed therein. The resultant masked wafer is immersed in an orthophosphoric acid etch for one minute, removing all the aluminum except the electrode contacts. Electrical connection is made to the base region by alloying the opposite-major surface of the wafer to a header utilizing an indium-doped gold alloy. Individual FET devices are separated by dicing the wafer into modules. The wafer is heated in hydrogen at 570° C. for one minute and annealed at 400° C. for three hours in hydrogen. Electrical contacts are made to the source and drain regions and the gate electrodes by connecting to the remaining portions of the aluminized film by thermo-compression bonding.

EXAMPLE II

A P-channel, enhancement mode field-effect transistor, as illustrated in FIG. 2 of the drawing, is formed as in the preceding paragraph except that an N-type silicon wafer having a concentration of $5 \times 10^{15}$ atoms of phosphorus per cc. is utilized as the starting material and the doped silicon-dioxide film is formed by substituting triethyl borate for the triethyl phosphate for the preceding example. Other process steps are substantially identical and the resultant structure is a P-channel device on an N-type silicon wafer.

EXAMPLE III

An N-channel, enhancement mode, field-effect transistor device is formed upon an N-type wafer substantially as follows. A one inch diameter 0.014 inch thick wafer of monocrystalline silicon having an impurity concentration of $10^{15}$ atoms per cc. of phosphorus and a (1, 0, 0) major surface is etched and washed as in Example I and placed in a reaction chamber and heated to 1000° C. for three hours in a dry oxygen atmosphere to form a 1200 A.U. thick film of silicon dioxide. The same film is then heated to 400° C. in a triode sputtering glow discharge for 15 minutes to form a 3000 A.U. film of molybdenum thereon.

The molybdenum-coated film is coated with a photoresist compound as in the previous examples and irradiated to form a pattern therein. After developing of the photoresist pattern and heating to harden the pattern, the wafer is immersed in a potassium-ferricyanide etch for one minute to pattern the molybdenum film in a concentric pattern corresponding to a circular drain and an annular gate region with apertures corresponding thereto. The patterned wafer is coated with a pyrolytically-deposited, 1000 A.U. thick film of boron-doped silicon dioxide by pyrolysis of ethyl orthosilicate and triethyl borate. After the doped oxide is formed the wafer is heated to a temperature of 1100° C. for 20 hours to cause the boron in the deposited film to diffuse through the oxide coating and the molybdenum to modify the entire surface-adjacent region of the silicon wafer to P-type conductivity to a depth of approximately 10 microns. The wafer is etched for one minute in buffered HF to remove the boron-doped oxide film. A 1000 A.U. thick film of phosphorus-doped $SiO_2$ is deposited over the wafer by the pyrolysis from a mixture of ethyl orthosilicate and triethyl phosphate as in the previous examples. The wafer is heated for 16 hours at a temperature of 1100° C. to cause discrete source and drain regions to be diffused with phosphorus atoms to cause surface-adjacent source and drain regions to be converted to N-type conductivity. A 3000 A.U. film of undoped $SiO_2$ is deposited over the wafer by pyrolysis from an argon atmosphere saturated with ethyl orthosilicate, as in the previous examples. The wafer is next patterned by a photoresist irradiation and developing step wherein discrete holes in the photoresist layer are made at regions corresponding to source, drain, and gate and a separate region corresponding to an exterior portion of the wafer. The remainder of the film is covered. After the formation of the photoresist pattern, the wafer is immersed in a buffered HF etchant for five minutes to remove silicon dioxide to the gate-electrode portion of the remaining molybdenum film, to the source and drain regions, and to the exterior portion of the molybdenum film through which contact to the base region is to be made. The wafer is removed and again masked with KPR, exposing only a portion of the base region contact area and immersed in a ferricyanide etch for one minute to remove that portion of the molybdenum film and again immersed in a buffered HF solution for two minutes to remove the oxide layer over the base region. The wafer is then metallized by evaporation of aluminum in vacuo for 30 seconds and the metallized wafer is covered with KPR at only regions corresponding to source, drain, and base-region contacts and gate-electrode contact. The covered wafer is immersed in the orthophosphoric acid etch, as before, for one minute to remove the unwanted aluminum, leaving only source, drain, gate, and base contacts. The wafer is heated and annealed and separate device portions thereof are separated and contacted as in Example I.

EXAMPLE IV

A plurality of FET modules, each including a pair of complementary field-effect transistors, one having an N-channel and the other having a P-channel are formed upon a wafer of N-type silicon having a concentration of approximately 1000 modules per square inch, by starting with a 0.014 inch thick wafer of silicon one inch in diameter having an exposed (1, 0, 0) major surface. The original silicon wafer is doped to N-type conductivity by the presence of $10^{15}$ atoms per c. of phosphorus. After etching in white etch and washing in distilled water, the wafer is heated in a dry oxygen atmosphere for three hours to form a 1200 A.U. thick layer of undoped high-purity, high quality silicon dioxide. The wafer is annealed in helium at 1000° C. for three hours, as before. The wafer is heated to a temperature of 400° C. in a triode sputtering apparatus and coated with a 3000 A.U. film of molybdenum as in previous examples. The molybdenum-coated wafer is coated with an undoped 3000 A.U. thick film of $SiO_2$ by pyrolysis from argon saturated with ethyl orthosilicate, as before, with the wafer at 800° C. for 15 minutes. The coated wafer is covered with KPR patterned to cover alternate FET regions corresponding to region 74 of FIG. 6. The coated wafer is etched in Buffered HF for three minutes to remove the exposed portions of the last-deposited film. A photoresist pattern including a pluraltiy of patterns of concentric rings with a central aperture therein is formed over the surface of the wafer. The water is then washed in Buffered HF for approximately three minutes and then etched in ferricyanide etch for approximately one minute to remove the uncoated portions of the molybdenum film. After washing in distilled water, the entire wafer is coated with a 1000 A.U. thick film of one percent boron-doped silicon dioxide by the passage of a flow of 7 cubic feet per hour of ethyl orthosilicate saturated argon and a 0.7 cubic foot per hour flow of triethylborate saturated boron over the wafer to cause the pyrolysis thereof. The wafer is then heated to a temperature of 1100° C. for 20 hours to cause the boron to diffuse through the passivating film causing the entire surface-adjacent region of the field-effect transistor units corresponding to region 73 of FIG. 6 to be entirely converted to P-type conductivity to a depth of approximately 10 microns, while in the portions of the wafer, corresponding region 74 of FIG. 6, only discrete source and drain regions are surface-diffused to form P-type source and drain regions. The wafer is next etched in buffered HF for two minutes to remove the remaining boron-doped oxide film.

The wafer is next coated with a 1000 A.U. thick film of phosphorus-doped silicon dioxide by pyrolysis from a 10:1 mixture of argon saturated, respectively, with ethyl orthosilicate and triethyl phosphate. This film is removed from the portions of the wafer corresponding to region 74 in FIG. 6 by photoresist and etching techniques, as described hereinbefore. The wafer is next heated for 16 hours at a temperature of 1100° C. to cause penetration of phosphorus into the field-effect transistor region 73 of the wafer to cause surface-adjacent, N-type conductivity-modified source and drain regions. The wafer is next contact-apertured, metallized, etched, contacted and heated as in the previous examples. The resultant wafer has a plurality of N-channel, field-effect transistors comprising a base region of P-type conductivity, discrete source and drain, surface-adjacent, N-type conductivity regions, and a gate electrode thereover, all having contacts made thereto by aluminum contacted through restricted diameter etched holes in the passivation oxide first deposited upon the wafer. The remaining alternate field-effect transistor devices have surface-adjacent conductivity-modified N-type regions and a gate electrode over the channel region therebetween and are similarly contacted. The wafer may be cut into any combination of field-effect transistors for the fabrication of monolithic or hybrid semiconductor modules.

While the foregoing specific examples of the fabrication of semiconductor devices in accord with the present invention have been set forth, it is to be understood that these examples are set forth for purposes of understanding and are not to be construed in a limiting sense.

From the foregoing, it is apparent that we have devised a new and useful family of self-registered field-effect transistors wherein the oxide coating which passivates the junctions is formed upon the wafer prior to diffusion and formation of the source and drain regions thereover, and that the oxide in the region of the P-N junctions is never removed or disturbed, until apertured for contact purposes providing excellent passivation and insulating characteristics thereto. Additionally, we have devised a method of forming a one-conductivity channel field-effect transistor on a one-conductivity-type semiconductor wafer. This method, combined with the method of forming a one-conductivity-type channel FET device on an opposite-conductivity-type wafer, particularly as described in accord with the first embodiment of the present invention, makes it possible to form complementary field-effect transistors, one having an N-channel and the other having a P-channel, all upon the same semiconductor substrate. This pairing may be repeated in any combination or pattern to form numerous logical elements and other integrated circuit modules, both monolithic and hybrid.

While the invention has been set forth herein with respect to certain examples and embodiments thereof, many modifications and changes will readily occur to those skilled in the art. Accordingly, by the appended claims we intend to cover all such modifications and changes as fall within the true spirit and scope of the invention.

What we claim as new and desire to secure by Letters Patent of the United States is:

1. The method of making a semiconductor field enhanced transistor including a base region of one-conductivity-type, a pair of surface-diffused discrete regions of opposite conductivity type defining therebetween a channel, and a gate electrode spaced over said channel, which method includes the steps of (a) forming a continuous high purity insulating and passivating film over a portion of one major surface of a semiconductor wafer, ($a_1$) said portion having one-conductivity-type characteristics;

(b) forming over said passivating insulating film a pattern comprising conductor-removed portions and conductor-remaining portions of a deposited conducting film which is nonreactive with said insulating passivating film at conductivity modifying activator diffusion temperatures, ($b_1$) one of said conductor-remaining portions corresponding to and spaced over said channel and constituting a gate electrode;

(c) diffusing through said insulating film in the portions thereof corresponding to conductor-removed portions of said pattern an activator for inducing opposite conductivity type characteristics into surface-adjacent portions of said wafer to form discrete spaced source and drain regions of opposite conductivity type defining therebetween said channel in self registry with said gate electrode without altering the passivation characteristics of said insulating film or the conductive properties of the conductor remaining portions of said conductive film;

(d) forming contact apertures through said insulating film in registry with said conductor-removed portion of said conductive film but of restricted dimension with respect thereto to contact said source and drain;

(e) making electrical contact to said source and drain through said contact apertures by forming a contact metal therein;

(f) making electrical contact to said base and to said gate electrode.

2. The method of claim 1 wherein diffusion of said activator to form said source and drain is effected by diffusing an activator from a film of activator-doped insulator overlying said source and drain regions.

3. The method of claim 2 wherein said activator doped insulator is left overlying said source and drain regions and contact apertures thereto are formed by etching through said activator doped film and said passivating film.

4. The method of claim 3 wherein an additional undoped insulating film is deposited over said wafer and contact apertures are etched therethrough.

5. The method of claim 3 wherein said activator doped film is removed after diffusion.

6. The method of claim 5 wherein an undoped insulator film is deposited over said wafer after said doped insulating layer is removed.

7. The method of claim 1 wherein said passivation layer is silicon dioxide.

8. The method of claim 7 wherein said silicon dioxide film is thermally grown upon a silicon semiconductor substrate.

9. The method of claim 1 wherein said one portion of said surface of said wafer is surface diffused into a wafer of opposite conductivity type semiconductor to form a one-conductivity-type base region therein and base a p-n junction with the remaining portion of said wafer, and a separate electrical contact is made to said opposite conductivity type region of said wafer to facilitate reverse biasing of said base junction.

10. The method of claim 9 wherein a complementary field effect transistor having a one-conductivity-type channel is formed upon a second portion of said major surface of said wafer.

11. The method of claim 10 wherein said complementary field effect transistor is formed on said second major surface portion of said wafer by forming said passivating insulating film thereover, forming a patterned conductive film thereover, surface-diffusing discrete source and drain regions of one-conductivity-type within said wafer to form source and drain regions of a second field effect transistor and defining therebetween a second channel which is self registered beneath a gate electrode formed by one conductor-remaining portion of said patterned conductive film which constitutes a second gate electrode.

12. The method of claim 10 wherein said second source and drain regions are formed simultaneously with said one-conductivity-type base region.

13. The method of claim 1 wherein said conductive film comprises a metal.

14. The method of claim 13 wherein said metal is selected from the group consisting of molybdenum and tungsten.

15. The method of claim 1 wherein said passivating film comprises one or more materials selected from the the group consisting of silicon dioxide, silicon nitride and silicon oxynitride.

16. The method of claim 15 wherein said passivation insulator comprises a first thermally grown film of silicon dioxide and a second deposited film of silicon nitride.

17. The method of forming an n-channel, self registered field effect transistor upon an N-type silicon substrate which method comprises:

(a) forming a thin film of thermally-grown silicon dioxide over one major surface of said N-type wafer;

(b) coating said oxide coated wafer with a film of molybdenum;

(c) forming a pattern in said molybdenum film, ($c_1$) said pattern comprising metal-removed portions and metal-remaining portions, and ($c_2$) one of said metal-remaining portions serving as a gate electrode for said field effect transistor;

(d) diffusing boron through said patterned molybdenum film and said silicon dioxide film to transform the major surface adjacent region of said wafer to a P-type conductivity-characteristic base region;

(e) selectively diffusing phosphorus through a plurality of metal-removed portions of said patterned molybdenum film to form two surface-adjacent N-type conductivity regions constituting source and drain regions and defining therebetween an n-channel region, ($e_1$) said n-channel being automatically in registry with said gate electrode;

(f) forming restricted dimension contact apertures in said silicon dioxide film to said source and drain regions;

(g) forming metallic members in said contact apertures to form source and drain contact electrode;

(h) making electrical contact to said source and drain electrodes, to said gate electrode and to said P-type region.

18. A method of forming a first n-channel field effect transistor having first source and drain regions, a first n-channel therebetween and in self registry with a first gate electrode at a first surface portion of an N-type silicon wafer and a second, p-channel field effect transistor having second source and drain regions, a second p-channel therebetween and in self registry with a second gate electrode at a second surface portion of said silicon wafer comprising the steps of:

(a) covering a major surface of said silicon semiconductor wafer with a thin continuous thermally grown silicon dioxide film;

(b) forming over said silicon dioxide film a patterned thin film of molybdenum having metal-removed portions and metal-remaining portions, ($b_1$) one of said metal remaining portions in said first portions of said wafer surface constituting a gate electrode for said first n-channel field effect transistor, and ($b_2$) one of said metal-remaining portions in said second surface portion of said wafer constituting a second gate electrode for said second p-channel field effect transistor;

(c) treating said wafer having said patterned molybdenum film thereon to render the surface thereof in said second surface portion of said wafer to be more impervious to boron diffusion than the surface thereof in said first surface portion;

(d) diffusing boron into said wafer so as to cause boron to pass through said patterned molybdenum film and said silicon dioxide film at said first wafer surface portion to convert the surface adjacent portion of said wafer in said first-portion to P-type conductivity to form a base region for said first n-channel field effect transistor while simultaneously causing boron to pass through said silicon dioxide film at second wafer surface portion only at regions corresponding to said metal-removed portions of said molybdenum film to form surface adjacent P-type source and drain regions defining therebetween a p-channel in self registry with said second gate electrode;

(e) diffusing phosphorus through said silicon dioxide film in discrete regions of said first wafer surface portion corresponding to metal-removed portions of said patterned molybdenum film thereat to form discrete N-type surface-adjacent first source and drain regions defining therebetween a first n-channel in self registry with said first gate electrode;

($e_1$) penetrating said silicon dioxide to form contact apertures to said first and second source and drain regions;

(f) forming metallic members in said first and second source and drain apertures to form first and second source and drain electrodes; and (g) making electrical contact to said first and second source, drain and gate electrodes.

References Cited

UNITED STATES PATENTS

| | | | |
|---|---|---|---|
| 3,233,186 | 2/1966 | Theriault. | |
| 3,246,173 | 4/1966 | Silver. | |
| 3,311,756 | 3/1967 | Nagata et al. | 307—88.5 |
| 3,387,358 | 6/1968 | Heiman | 29—571 |
| 3,461,361 | 8/1969 | Delivorias | 29—571 |

JOHN F. CAMPBELL, Primary Examiner

W. TUPMAN, Assistant Examiner

U.S. Cl. X.R.

29—578, 589; 317—235